US007061799B2

United States Patent
Kawai et al.

(10) Patent No.: US 7,061,799 B2
(45) Date of Patent: *Jun. 13, 2006

(54) NONVOLATILE SEMICONDUCTOR MEMORY DEVICE

(75) Inventors: Koichi Kawai, Yokohama (JP); Kenichi Imamiya, Tokyo (JP); Koji Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/836,994

(22) Filed: Apr. 30, 2004

(65) Prior Publication Data

US 2004/0202037 A1    Oct. 14, 2004

Related U.S. Application Data

(63) Continuation of application No. 10/371,306, filed on Feb. 21, 2003, now Pat. No. 6,751,122.

(30) Foreign Application Priority Data

Oct. 30, 2002    (JP)    ............................. 2002-316719

(51) Int. Cl.
    *G11C 16/06*    (2006.01)
(52) U.S. Cl. ........................ 365/185.09; 365/185.17; 365/185.2; 365/185.22
(58) Field of Classification Search ........... 365/185.09, 365/185.17, 189.05, 189.07, 185.2, 185.33, 365/189.01, 200, 185.22
    See application file for complete search history.

(56) References Cited

U.S. PATENT DOCUMENTS

| 5,345,413 | A * | 9/1994 | Fisher et al. ................... 365/96 |
| 6,058,048 | A * | 5/2000 | Kwon .................... 365/185.33 |
| 6,462,985 | B1 * | 10/2002 | Hosono et al. ......... 365/185.09 |
| 6,646,930 | B1 * | 11/2003 | Takeuchi et al. ............. 365/200 |
| 6,680,858 | B1 | 1/2004 | Nakamura et al. |
| 6,751,122 | B1 * | 6/2004 | Kawai et al. .......... 365/185.09 |
| 6,760,256 | B1 * | 7/2004 | Imamiya ................. 365/185.17 |

FOREIGN PATENT DOCUMENTS

JP    2001-176290    6/2001

* cited by examiner

*Primary Examiner*—Connie C. Yoha
(74) *Attorney, Agent, or Firm*—Hogan & Hartson, L.L.P.

(57) ABSTRACT

The nonvolatile semiconductor memory device includes a memory cell array containing a plurality of nonvolatile memory cells and an initial setup data region in which initial setup data specified to determine operation conditions of the device is to be written. The device further includes a detection circuit which detects turn-on of power. The device further includes a readout circuit which reads out the initial setup data from the initial setup data region of the memory cell array upon detecting power-on by the detection circuit. The device further includes a determination circuit which determines whether the initial setup data read out by the readout circuit is effective or ineffective. The device further includes a setup circuit which sets up the device in an operative-prohibiting status when the initial setup data is determined as ineffective by the determination circuit.

26 Claims, 6 Drawing Sheets

NONVOLATILE SEMICONDUCTOR MEMORY DEVICE

This is a continuation of application Ser. No. 10/371,306 filed Feb. 21, 2003, now U.S. Pat. No. 6,751,122 which application is hereby incorporated by reference in its entirety.

CROSS-REFERENCE TO RELATED APPLICATIONS

This application is based upon and claims the benefit of priority from prior Japanese Patent Application No. 2002-316719, filed Oct. 30, 2002, the entire contents of which are incorporated herein by reference.

BACKGROUND OF THE INVENTION

1. Field of the Invention

The present invention relates to a nonvolatile semiconductor memory device. More specifically, the present invention relates to an integrated circuit chip in which initialization is performed by using a ROM Fuse.

2. Description of the Related Art

Integrated circuit chips (IC chips) such as NAND type EEPROM having a electrically programmable nonvolatile semiconductor memory have increasingly employed a ROM fuse for an initial setup operation (for example, see Japanese Patent Application No. 2001-176290). The ROM Fuse is a predetermined data region 101a on a memory cell array (or dedicated memory) 101, in which various initial setup values required for initializing an IC chip are stored, as shown in FIG. 12. The various initial setup values stored in the predetermined-data region 101a are automatically read by a sense amplifier (S/A) 105 immediately when the power-on of the IC chip is detected by a control circuit 103.

The various initial setup values read out from a ROM Fuse are then transferred to individual registers (data latch circuits) 107a, 107b, and 107c and stored therein. The various initial setup values stored in individual registers 107a, 107b, and 107c are respectively sent to the corresponding circuits. For example, the initial setup values for setting up a write voltage and erase voltage stored in the register 107c are sent to a high-voltage generation circuit 109. In this manner, the initial setup operation (initialization) of the IC chip is performed. The ROM Fuse is advantageous since the design can be made with a high degree of freedom compared to conventional fuses such as a laser-melt type fuse and the cost for a test run can be saved. Accordingly, the demand for the ROM Fuse has recently increased.

However, since initial setup values are actually written in memory cells in the form of data in a ROM Fuse, the reliability of data is lower than those of conventional fuses. To overcome the low reliability, the following method has been contemplated.

For example, not a single set of initial setup data but several sets thereof are stored in a ROM Fuse and the initial setup data of individual sets are compared at power-on. If this method is employed, the reliability of data can be improved.

As explained above, the reliability of data in a ROM Fuse can be improved by comparing several sets of initial setup data. However, there is a possibility that data gets garbled. It is also considered that all initial setup data of each set may be put in a FAIL status. More specifically, in the initial setup operation, since data is read out when power is turned on, the readout data greatly varies depending upon the state of power. Consequently, it is sometimes impossible to correctly read out the initial setup data. In such a case, effective initial setup data cannot be set during the initial setup operation. This inevitably means the initialization of the IC chip is incomplete. For example, defective cells have not been replaced for redundancy and the trimming of power has not been performed.

When the initialization is not effectively made not only a normal memory operation of an IC chip cannot be ensured but also disappearance of valuable cell data and destruction of memory cells themselves may occur. Accordingly, it has been desired to develop an effective means for protecting an IC chip from the disappearance of cell-data and so forth even when the initial setup operation is not successfully completed by failure of the initial setup operation.

BRIEF SUMMARY OF THE INVENTION

According to an aspect of the present invention, these is provided a nonvolatile semiconductor memory device, comprising a memory cell array containing a plurality of nonvolatile memory cells and an initial setup data region in which initial setup data specified to determine operation conditions of the device is to be written; a detection circuit which detects turn-on of power; a readout circuit which reads out the initial setup data from the initial setup data region of the memory cell array upon detecting power-on by the detection circuit; a determination circuit which determines whether the initial setup data read out by the readout circuit is effective or ineffective; and a setup circuit which sets up the device in an operative-prohibiting status when the initial setup data is determined as ineffective by the determination circuit.

DETAILED DESCRIPTION OF THE INVENTION

Now, the embodiments of the present invention will be explained with reference to the accompanying drawings.

(First Embodiment)

Figure 1:
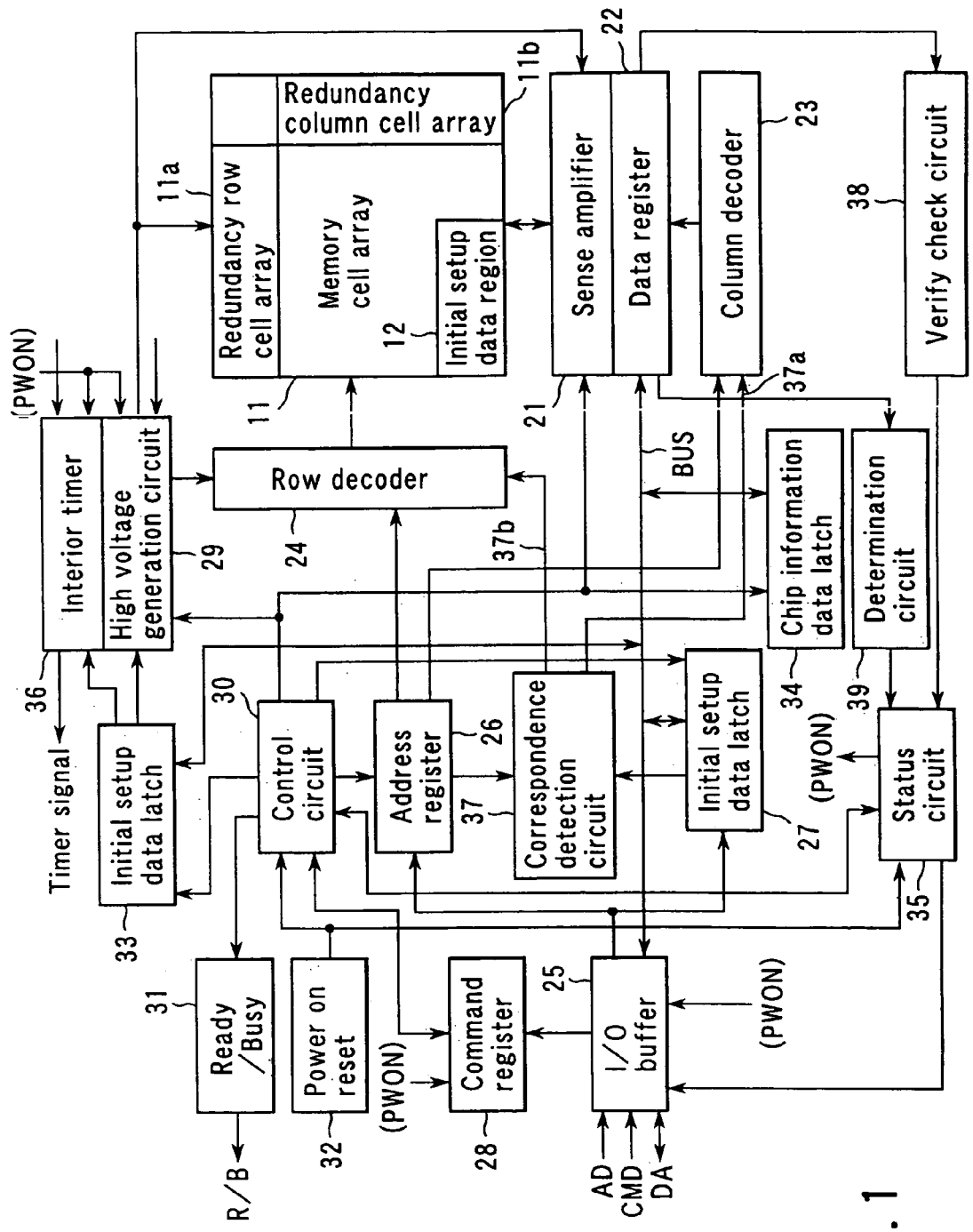
FIG. 1 is a block diagram showing an arrangement of a NAND type EEPROM according to a first embodiment of the present invention.

FIG. 1 shows an arrangement of an IC chip (an NAND type EEPROM) having a nonvolatile semiconductor memory such as a NAND type flash memory, according to a first embodiment of the present invention. In FIG. 1, a memory cell array 11 of a nonvolatile semiconductor memory is a matrix form of electrically programmable nonvolatile memory cells. Each nonvolatile memory cell has a MOS transistor structure of a stacked gate type in which a floating gate and a control gate are stacked. The memory cell array 11 contains a redundancy row cell array 11a and a redundancy column cell array 11b for replacing a defective cell(s) by a non-defective cell(s). The initial setup data region 12 of the memory cell array 11 is previously determined as a ROM Fuse for writing various initial setup data required for initializing a NAND type EEPROM. The initial setup data is fuse data for determining operation conditions of the memory during the start-up of the NAND type EEPROM following the power-on.

Figure 2:
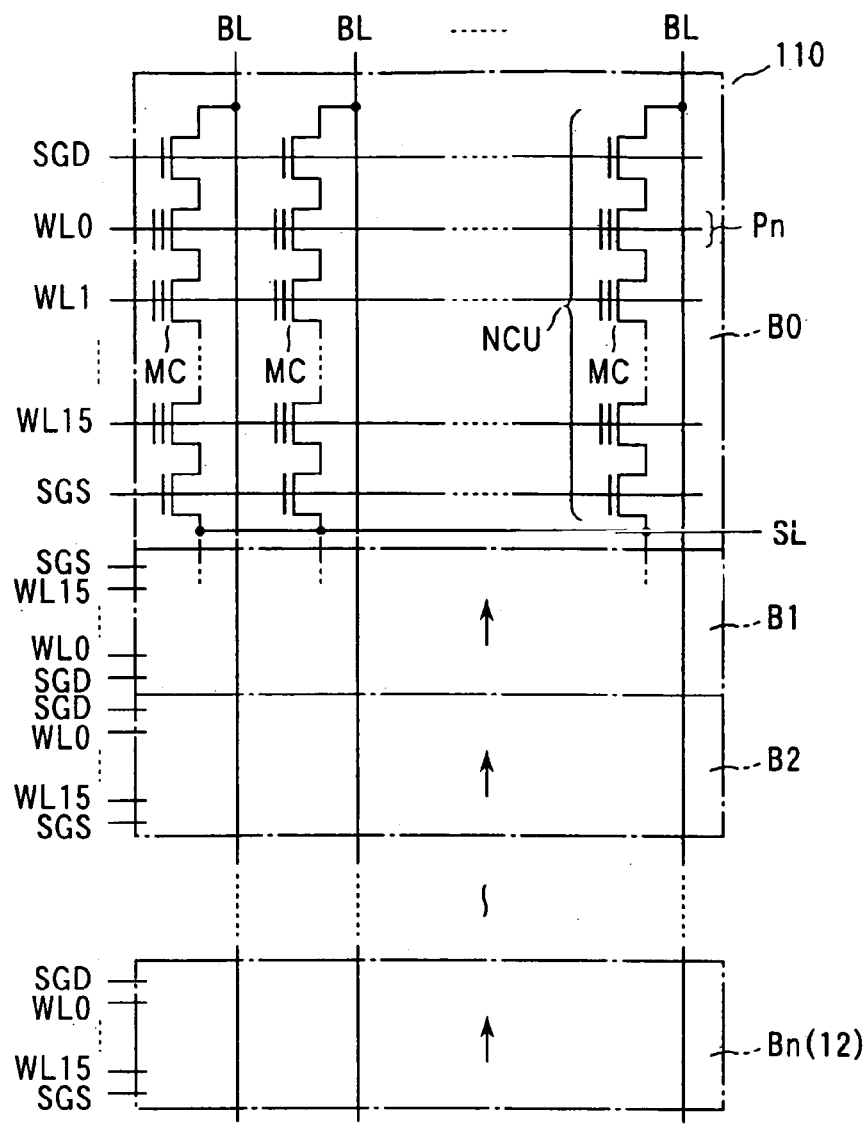
FIG. 2 is a circuit arrangement of a memory cell array (plane) in the NAND type EEPROM.

FIG. 2 shows a specific arrangement of the memory cell array 11. In this case, the memory cell array 11 has a plurality of planes 110. In each plane 110, 16 memory cells MC are connected in series, thereby forming a single NAND cell unit NCU. A plurality of NAND cell units share common word lines WLn (n=0 to 15), respectively form cell blokes B0, B1 to Bn, which are minimum units for erasing data. The cell blokes B0, B1 to Bn arranged share a common bit line BL.

In each of the planes 110 thus arranged, a cell block Bn is defined as an initial setup data region 12 for storing initial setup data. In the initial setup data region 12, data is written, erased and read out by driving bit line BL and a word line WLn selectively. However, as described later, the initial setup date region 12 is prohibited from gaining access thereto from the outside during the regular memory operation of a NAND type EEPROM. Therefore, when data is erased by one operation or block by block, the initial setup data region 12 is eliminated from the regions to be erased.

In the NAND type flash memory, as shown in FIG. 2, the minimum unit of the initial setup data region 12 is the cell block Bn, which is the same in structure as other cell blocks B0 to Bn−1. Therefore, the layout and circuit operation are the same as those of a regular NAND type flash memory, so that circuit design can be easily made. In contrast, when the initial setup data to be memorized in the initial setup data region 12 is small in size, the cell block may contains a lower number of word lines compared to a regular NAND type flash memory. In this way, the area occupied by the initial setup data region 12, in other words, the size of the memory cell array, can be reduced compared to the case in which the cell block Bn is configured similarly to cell blocks B0 to Bn−1.

The NAND type flash memory has a unit called "page (Pn)", which is formed of a plurality of column addresses. The page is responsible for reading out data simultaneously from a plurality of memory cells MC. The pages are sequentially numbered from 0 to 15 (n=0 to 15, called a page address number). Data is read out simultaneously from the page address designated in a regular memory operation.

Each bit line BL of the memory cell array 11 is connected to a sense amplifier (S/A) circuit 21 serving as a readout circuit, as shown in FIG. 1. To the sense amplifier circuit 21, a data register 22 is connected. Furthermore, a column recorder 23 for selecting a bit line BL and a row decoder 24 for selecting a word line WLn are provided in the NAND type EEPROM.

Address data AD, and command data (control signal) CMD are input from an I/O buffer 25. Input/output data DA is input into and output from the I/O buffer 25. The address data AD is loaded into an address register 26 and an initial setup date latch circuit 27. The command data CMD is loaded into a command register 28. Of the input/output data DA, data to be written is loaded into the data register 22 through a data bus BUS.

The row address is sent from the address register 26 to the row decoder 24 and decoded therein. The column address is sent from the address register 26 to the column decoder 23 and decoded therein. In this manner, a memory cell MC is selected.

High voltages used in a data write operation and data erase operation are generated by a high voltage generation circuit 29, which comprises a charge pump oscillator. The high voltage from the high voltage generation circuit 29 is supplied separately to a memory cell array 11, a sense amplifier circuit 21 and the row decoder 24.

The command data CMD loaded into the command register 28 is decoded in the control circuit 30. The command data is responsible for sequential control performed by the control circuit 30 during data-write operation and data-erase operation. For example, the sequence control is performed during the data-write operation as follows. The data-write operation is performed in a selected memory cell MC and then the verify operation is performed for verifying whether data is written or not. At this time, if an insufficiently written memory cell is found, data-write is performed again. The sequence control is performed during the data-erase operation as follows. The data-erase operation is performed in a selected cell blocks B0, B1 to Bn−1 and then the verify operation is performed for verifying whether data is erased or not. At this time, if the erase is not sufficiently performed, erase operation of data is performed again. It is a control circuit 30 that a series of data write or data erase are sequentially performed in the aforementioned manner in accordance with the writing mode or erase mode previously set.

The control circuit 30 controls a Ready/Busy buffer 31, initial setup data latch circuit 33, chip information data latch circuit 34 and status circuit (setup circuit) 35, other than the high voltage generation circuit 29, the sense amplifier circuit 21, the address register 26, the command register 28, and the initial setup data latch circuit 27.

The Ready/Busy buffer 31 outputs a Ready/Busy signal R/B upon instruction from the control circuit 30. The Ready/Busy signal R/B (=Low denotes "busy") is used for informing that the access from the outside is prohibited. For example, the Ready/Busy buffer 31 outputs a Ready/Busy signal R/B (=Low) to the outside until the initial setup operation (initialization of a NAND type EEPROM) is completed during the start-up of a NAND type EEPROM following the power-on.

The NAND type EEPROM further comprises a power-on reset circuit (detection circuit) 32, interior timer circuit 36, correspondence detection circuit 37, and determination circuit 39. Furthermore, a verify check circuit 38 is provided as needed.

When the power is turned on, the power-on reset circuit 32 starts working to output a detection signal LOWVDDn (=High) to the control circuit 30 and the status circuit 35.

The verify check circuit 38 executes the aforementioned verify operation. The verify check circuit 38 outputs a "Fail" signal PROG_FAILn (=Low) to the status circuit 35 when data-writing is not sufficiently made. Furthermore, the verify check circuit 38 outputs a "Fail" signal ERASE_FAILn (=Low) to the status circuit 35 when data-erasing is not sufficiently made.

The initial setup data to be written in the initial setup data region 12 of the memory cell array 11 includes defective address data, individual parameters for memory operation, and chip information. To be more specific, the "defective address data" refers to the address of a defective cell found by a wafer test. The term "individual parameters" for memory operation include voltage data for data write and erase and the numbers of control loops for the data write and erase operations. The "chip information" includes a memory capacity, specification code and manufacturer's code.

The writing to the initial setup data region 12 of the initial setup data is performed by, for example, inputting a specific command after chips are packaged and before products are shipped. More specifically, the row decoder 24 and column decoder 23 are configured accessible to the entire memory cell array 11 including the initial setup data region 12. However, the address of the initial setup data region 12 is not generated during regular data write or read operations. In other words, the initial setup data region 12 cannot be assigned by the address thus inputted from the outside during the regular memory operation. Only when a specific command data CMD is input into the I/O buffer 25, the control circuit 30 controls the address register 26 to generate the interior address required for gaining access to the initial setup data region 12. In this manner, the initial setup data is written in the initial setup data region 12.

As described above, in the NAND type EEPROM with a ROM Fuse in which initial setup data is stored in the initial setup data region 12 of the memory cell array 11, the initial setup operation is automatically performed by reading out the initial setup data from the initial setup data region 12 when the power is turned on. FIG. 1 shows an initial setup data latch circuit 27 for holding defective address data, an initial setup data latch circuit 33 for holding individual parameters for controlling the high voltage generating circuit 29 and the interior timer circuit 36, and a chip information data latch circuit 34 for holding chip information. The data read out from the initial setup data region 12 and the transfer of the initial setup data thus read to the initial setup data latch circuits 27 and 33 and the chip information data latch circuit 34 are controlled by the control circuit 30. The data transfer of the initial setup data thus read is controlled based on the determination results of the determination circuit 39 as described later.

To explain more specifically, when the power is turned on, the power-on reset circuit 32 starts operation, allowing the control circuit 30 to detect that power is turned on. After a predetermined period of time for stabilizing the power, the control circuit 30 sets a read out mode and an interior address for gaining access to the initial setup data region 12 is generated in the address register 26. Such an interior address is not assigned by the regular memory operation as described above. The initial setup data within the initial setup data region 12 corresponding to the interior address is accessed by the column decoder 23 and the row decoder 24. The initial setup data accessed is automatically read by the sense amplifier circuit 21. The initial setup data thus read is transferred to the data register 22 and stored therein. The initial setup data stored in the data register 22 is confirmed for effectiveness by the determination circuit 39. Of the initial setup data stored in the data register 22, only the effective data determined by the determination circuit 39 is transferred by the control circuit 30 to the initial setup data latch circuits 27 and 33 and the chip information data latch circuit 34 through data BUS and thereby stored therein. By setting effective initial setup data in this manner, the initial setup operation is successfully completed.

The control circuit 30 further controls the Ready/Busy buffer 31. More specifically, the control circuit 30 allows the Ready/Busy buffer 31 to output a Ready/Busy signal R/B (=Low), which informs prohibition of access from the outside, during the initial setup operation. When the initial setup operation successfully completes, a Ready/Busy signal R/B is put in a standby (=High) status.

Figure 4:
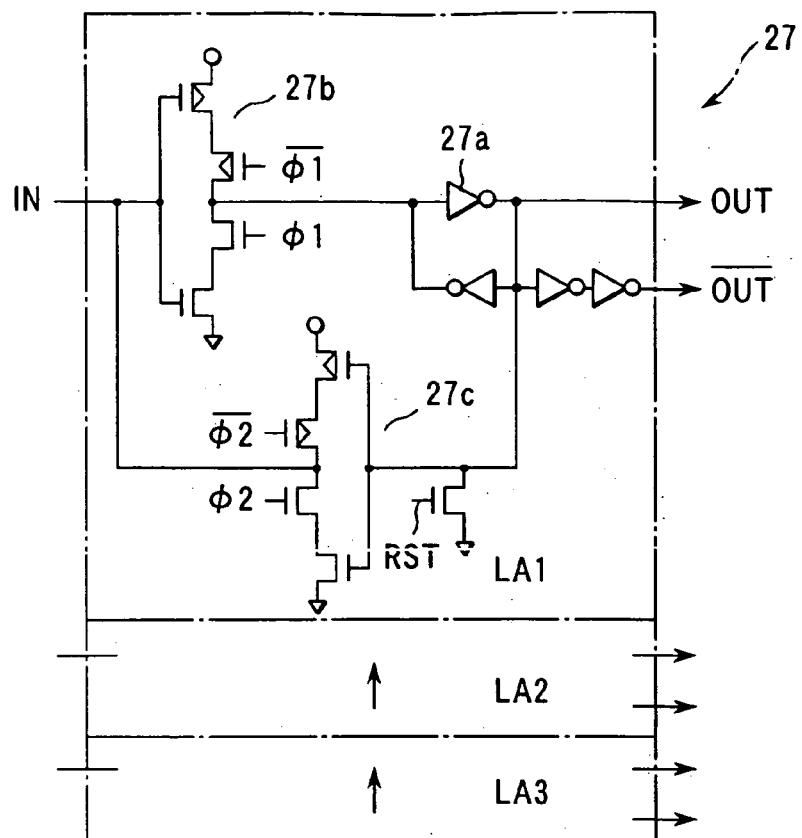
FIG. 4 is a circuit arrangement showing an initial setup data latch circuit of the NAND type EEPROM.

FIG. 4 shows an arrangement of the initial setup data latch circuit 27 having defective address data. The initial setup data latch circuit 27 has latch circuits LA1 to LAm, which are required for writing defective address data. In other words, the number of latch circuits LA1 to LAm is determined depending upon the sizes of the redundancy row cell-array 11a and the redundancy column cell array 11b. Each of the latch circuits LA1 to LAm has a latch main body 27a, a clocked inverter 27b for loading defective address data, and a clocked inverter 27c for fetching the defective address data thus loaded to data BUS near the input side. The initial setup data latch circuit 27 is reset by a reset signal RST, which is generated at power-on as well as during a test-mode. However, the reset cannot be made during the regular memory operation.

The arrangements of the initial setup data latch circuit 33 and the chip information data latch circuit 34 are the same as that of the initial setup data latch circuit 27.

When the initial setup operation is properly completed, the Ready/Busy signal R/B is put in a standby status (=High), which enables the regular memory operation including data-read, write and erase operations. In the regular operation mode, address data AD is input by the I/O buffer 25. Consequently, the correspondence/non-correspondence between the address data AD loaded into the address register 26 and the defective address data stored in the initial setup data latch circuit 27 is determined by the correspondence detection circuit 37. When the correspondence between them is detected, a replacement control signal 37a is output to a column decoder 23 and a replacement control signal 37b is output to the row decoder 24, respectively. The row decoder 24 and the column decoder 23 are controlled by the replacement control signals 37a and 37b, respectively. As a result, defective cells are replaced by using the redundancy row cell array 11a and the redundancy column cell array 11b.

The interior timer circuit 36 is controlled by a desired parameter stored in the initial setup data latch circuit 33. It follows that a predetermined timer signal required for a memory operation is generated by the interior timer circuit 36. The high voltage generation circuit 29 is controlled by a desired parameter stored in the initial setup data latch circuit 33. In this manner, a predetermined voltage is generated from the high voltage generation circuit 29 in accordance with each of operations such as data write, erase, and read operations.

In the embodiment, a test mode can be set preferably by inputting a predetermined command data CMD. For example, the initial setup data stored in the initial setup data region 12 of the memory cell array 11 can be checked in a certain test mode, whereas renewed in another test mode (which is stored in the initial setup data region 12 of the memory cell array 11).

When a defective cell is present in the initial setup data region 12, if the initial setup data is written by ignoring the presence of the defective cell, the initial setup operation cannot be properly completed.

If the reliability of the initial setup data read out from the initial setup data region 12 is low, data effective as the initial setup data cannot be stored in individual data latch circuits 27, 33 and 34. Even if the initial setup data is correctly written in a non-defective cell of the initial setup data region 12, the initial setup data sometimes cannot be accurately read out from the initial setup data region 12 depending upon the power-on state. Also, in: this case, the initial setup operation cannot be successfully completed. For example, when the parameter for controlling the high voltage generation circuit 29 and stored in the initial setup data latch circuit 33 is not effective initial setup data, abnormal generation of voltage occurs. As a result, as is often the case, important cell data may disappear and memory cells MC may break.

In the initial setup operation, it is necessary to determine whether or not the initial setup data read out from the initial setup data region 12 is effective. When effective initial setup data is not stored in data latch circuits 27, 33 and 34, the chip status is fix to "Fail" and such a signal indicating "Fail" is informed to the outside. In this manner, it is possible to prevent disappearance of valuable cell data and breakage of memory cells MC when the initial setup operation cannot complete properly.

Now, a method of determining whether the initial setup data read out from the initial setup data region 12 is effective or not will be explained in detail below.

Figure 5:
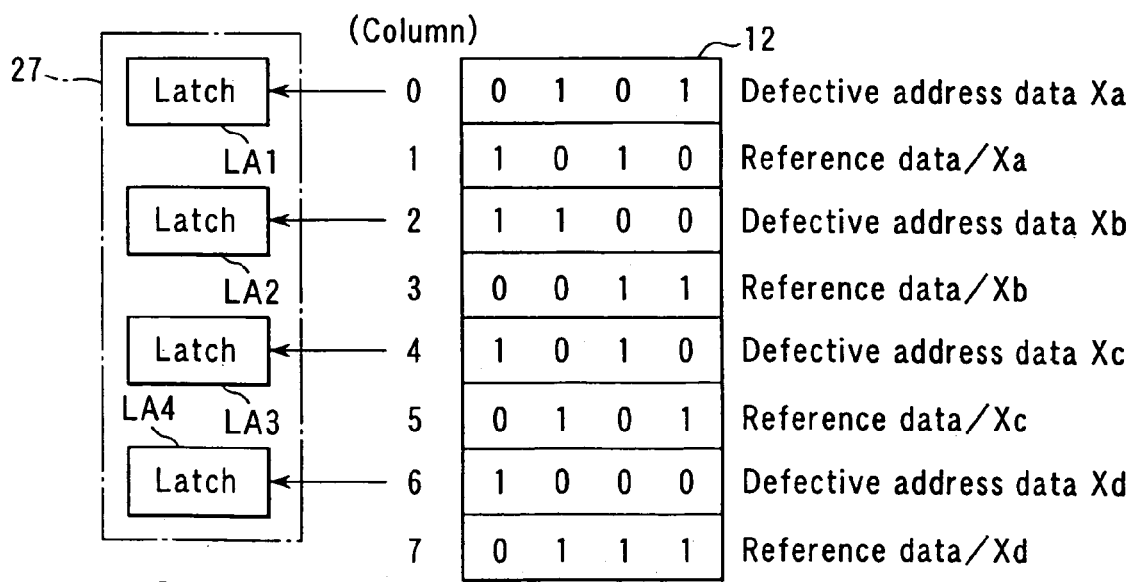
FIG. 5 is an illustration of the initial setup data stored in the initial setup data region.

FIG. 5 shows an example as to how to store the initial setup data in the initial setup data region 12. In this example, a case where defective address data (control data) Xa, Xb, Xc, and Xd are used will be explained. Defective address data Xa, Xb, Xc, and Xd, which are expressed by 4 bits, are written in respective columns (a word line) within the initial setup data region 12. A first defective address data Xa is represented by "0101". The defective address data Xa is written in column 0 and the reference data /Xa represented by "1010", which is complementary to the defective address data Xa, is stored to column 1. If the next defective address data Xb is represented by "1100", Xb is stored in column 2. The reference data /Xb represented by "0011", which is complementary to the defective data Xb, is stored in column 3. Similarly, if the following defective address data Xc is represented by "1010", then the data Xc is stored in column 4. In column 5 of the initial setup data region 12, the reference data /Xc, "0101" is stored. If the last defective address data Xd is represented by "1000", then the data Xd is stored in column 6. The reference data /Xd, "0111" is stored in column 7 of the initial setup data region 12.

In the initial setup operation by the control circuit 30, whether defective address data Xa, Xb, Xc and Xd are effective or not is determined based on reference data /Xa, /Xb, /Xc, and /Xd. Only the defective address data Xa, Xb, Xc, and Xd whose effectiveness has been confirmed are transferred to the initial setup data latch circuit 27 and stored in latch circuits LA1 to LA4.

The effectiveness of defective address data. Xa, Xb, Xc, and Xd (in other words, whether these data is effective data or not) is confirmed by the determination circuit 39 as sown in FIG. 6. In the determination circuit 39, defective address data Xa, Xb, Xc and Xd are input in a reference circuit (e.g., EXNOR circuit) 39b through an inverter circuit 39a. Furthermore, reference data /Xa, /Xb, /Xc, and /Xd (which correspond to Xa, Xb, Xc and Xd, respectively) are input in the reference circuit 39b. In this case, the defective address data Xa, Xb, Xc and Xd and reference data /Xa, /Xb, /Xc, and /Xd are simultaneously read out from the initial setup data region 12 by the sense amplifier circuit 21 and sequentially supplied to the determination circuit 39 through the data register 22. Based on the correspondence or non-correspondence between defective address data (Xa, Xb, Xc and Xd) and reference address data (/Xa, /Xb, /Xc, and /Xd), the effectiveness of the defective address data Xa, Xb, Xc, and Xd is confirmed For example, if the defective address data Xa and the reference data /Xa is complementary to each other, then a determination signal COMP (=High) is output to the status circuit 35 from the reference circuit 39b as an output from the determination circuit 39. In this manner, it is confirmed in the status circuit 35 that the defective address data Xa read out from the initial setup data region 12 is effective. Thereafter, the defective address data Xa is transferred to the initial setup data latch circuit 27. The status circuit 35 sets the chip status in "Pass". As a result, the transfer gate (not shown) for transferring the defective address data Xa to the initial setup data latch circuit 27 is turned on by the control circuit 30. In contrast, if the defective address data Xb and the reference data /Xb are not confirmed as being complementary to each other, then a determination signal COMP (=Low) is output from the reference circuit 39b to the status circuit 35 as an output from the determination circuit 39. Based on this, it is considered, in the status circuit 35, that the defective address data Xb read out from the initial setup data region 12 is not effective, that is, ineffective initial setup data. Thereafter, the chip status is fixed to "Fail", as described above.

Figure 7:
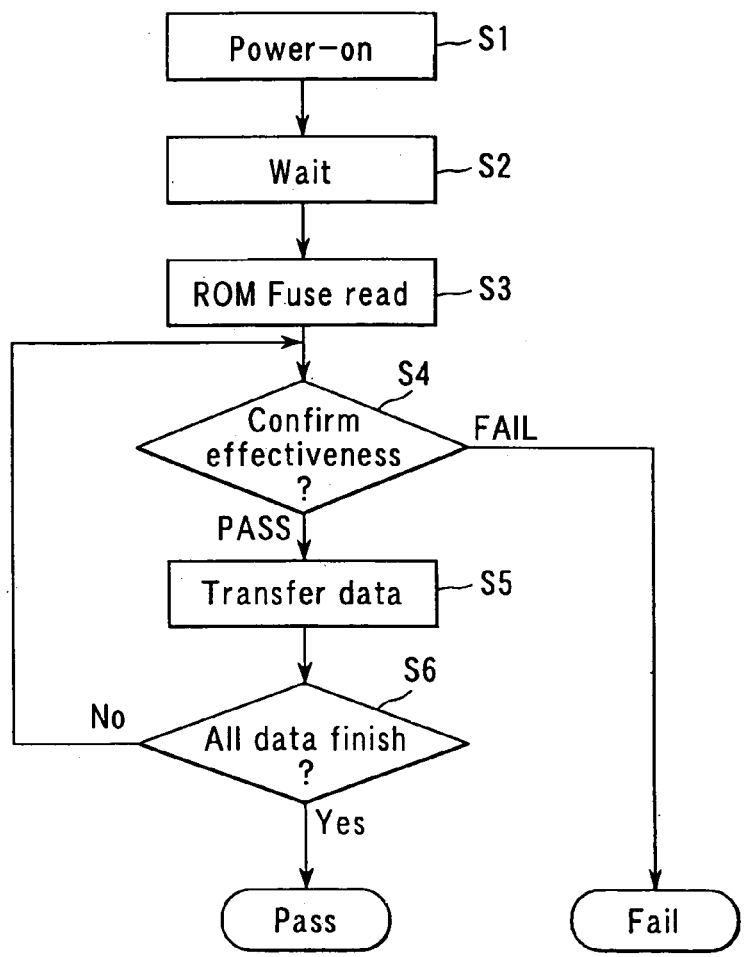
FIG. 7 is a flowchart for explaining the flow of the initial setup operation in the NAND type EEPROM.

FIG. 7 shows the operational flow including the step of confirming the effectiveness of initial setup data in the initial setup operation. To explain more specifically, when power is turned on, a power-on reset circuit 32 starts operation (Step S1). The control circuit 30, which detects that the power is turned on, is put in a standby status until the power is stabilized (Step S2). Thereafter, a reading mode is set up. Based on the reading mode, the initial setup data within the initial setup data region 12 is automatically read out by the sense amplifier circuit 21 in accordance with the interior address generated by the address register 26 (Step S3). The initial setup data (control data and reference data) thus read out are sequentially sent to the determination circuit 39 and thereby the effectiveness of the initial setup data is confirmed (Step S4). When the effectiveness is confirmed ("PASS"), a determination signal COMP (=High) is output to the status circuit 35 from the determination circuit 39. As a result, the initial setup data is transferred to the initial setup data latch circuits 27 and 33 or a chip information data latch circuit 34 (Step S5). In contrast, when the effectiveness of the initial setup data is not confirmed in the step S4 ("FAIL"), a determination signal COMP (=Low) is output from the determination circuit 39 to the status circuit 35, and thereby the chip status is fixed to a Fail status by the status circuit 35. In this case, the initial setup data is not transferred to each of data latch circuits 27, 33 and 34. The procedures from step S4 onward are repeated until the effectiveness of all initial setup data read out from the initial setup data region 12 is completely confirmed (Step S6).

Figure 3:
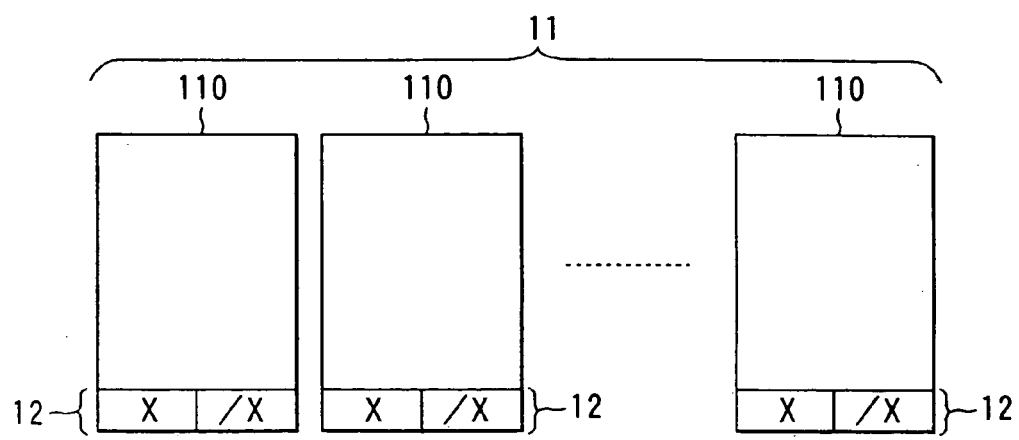
FIG. 3 is an illustration showing an initial setup data region provided on each plane of the memory cell array.

In this embodiment, for example, as shown in FIG. 3, each of cell blocks Bn of planes 110 composing a memory cell array 11 is set as the initial setup data region 12. The same initial setup data (control data X, reference data /X) is written in each initial setup data region 12. In this manner, several sets of initial setup data are stored in a ROM Fuse and the effectiveness of the initial setup data is finally confirmed. In this manner, the reliability of the initial setup data can be improved. Consequently, even if the reliability of initial setup data is extremely low, the accuracy of the initial setup operation (probability of successful operation) can be improved.

According to the method mentioned above, the effectiveness of the defective address data read out in the step of confirming the effectiveness can be more accurately confirmed. In addition, even if a defective cell is present in the initial setup data region 12, an effective defective address data can be transferred to the initial setup data latch circuit 27.

Figure 6:
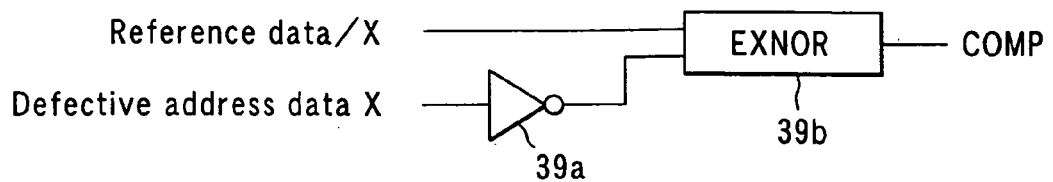
FIG. 6 is an arrangement of a determination circuit in the NAND type EEPROM.

The determination circuit 39 for confirming the effectiveness of the defective address data is not limited to the arrangement shown in FIG. 6. For example, a defective address data X is directly input to the reference circuit 39b, the reference data /X to be input to the reference circuit 39b may be supplied through the inverter circuit 39a. Alternatively, to improve the legality of defective address data, ECC (error correction code) may be used in the reference circuit. Furthermore, depending upon the configuration of an NAND type EEPROM, the correspondence detection circuit 37 may be used as the determination circuit 39.

With respect to reading the initial setup data and confirming the effectiveness thereof in an initial setup operation, various methods are disclosed in, for example, Japanese Patent Application No. 2001-176290; however, detailed explanation thereof is omitted herein.

Next, the measures to overcome the case where the effectiveness of the initial setup data is not confirmed and therefore the initial setup operation does not properly complete will be explained. In the embodiment, when the initial setup operation does not complete properly, the chip status is fixed to "Fail" by the status circuit 35 (PASS/FAIL signal=Low). By virtue of this, it is possible to protect a NAND type EEPROM such that valuable cell data does not disappear and memory cells MC do not break.

Figure 8:
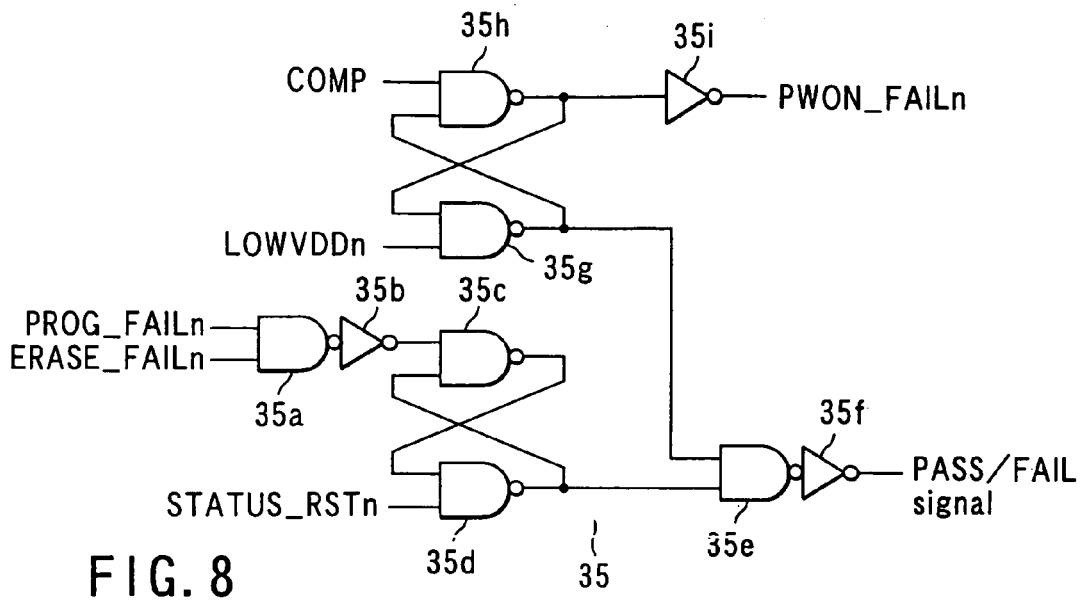
FIG. 8 is an arrangement of a status circuit in the NAND type EEPROM.

In the status circuit 35, a data-writing fail signal PROG_FAILn (=Low) is supplied to one of input terminals of a NAND circuit 35a from a verify check circuit 38, for example, as shown in FIG. 8. To the other input terminal of the NAND circuit 35a, a data-erasing fail signal ERASE_FAILn (=Low) is supplied from the verify cheek circuit 38. The output from the NAND circuit 35a is supplied to one of the input terminals of a NAND circuit 35c through an inverter circuit 35b. To the other input terminal of the NAND circuit 35c, the output from a NAND circuit 35d is supplied. The output of the NAND circuit 35c is supplied to one of the input terminals of the NAND circuit 35d. To the other input terminal of the NAND circuit 35d, a reset signal (STATUS_RSTn) is supplied from the control circuit 30. The output of the NAND circuit 35d is supplied to one of the input terminals of a NAND circuit 35e. The output of the NAND circuit 35e is supplied to an inverter circuit 35f. In this manner, a PASS/FAIL signal is output from the inverter circuit 35f. The PASS/FAIL signal is supplied to the I/O buffer 25 and the control circuit 30.

To the other input terminal of the NAND circuit 35e, the output from a NAND circuit 35g is supplied. One of the input terminals of the NAND circuit 35g, the output of the power-on reset circuit 32 (detection signal LOWVDDn) is supplied. Furthermore, to the other input terminal of the NAND circuit 35g, the output of a NAND circuit 35h is supplied. One of the input terminals of the NAND circuit 35h, the output of the determination circuit 39 (determination signal COMP) is supplied. To the other input terminal of the NAND circuit 35h, the output of the NAND circuit 35g is supplied. The output of the NAND circuit 35h is supplied also to an inverter circuit 35i. In this way, a fail signal PWON_FAILn is output from the inverter circuit 35i. The PWON_FAILn is supplied to the I/O buffer 25, the command register 28, the high voltage generation circuit 29 and the interior timer circuit 36.

In this case, the PASS/FAIL signal controlled in accordance with fail signals PROG_FAILn (=Low) and ERASE_FAILn (=Low) is fixed to "Low" by a detection signal LOWVDDn (=High) of power-on and a determination signal COMP (=Low) for confirming effectiveness. More specifically, if the initial setup operation does not complete properly at power-on, the reset signal STATUS_RSTn (=High) will not reset a PASS/FAIL signal for setting the chip status at the fail status.

The PASS/FAIL signal fixed to "Low" is output from the I/O buffer 25 to the outside as an input/output data DA, which indicates that the initial setup operation does not properly completed. Furthermore, the PASS/FAIL signal (=Low) is supplied to the control circuit 30. In this way, it is possible to prohibit the transfer of noneffective initial setup data to each of data latch circuits 27, 33 and 34. As a result, the following regular memory operation is continuously prohibited. Therefore, it is possible to prevent disappearance of valuable cell data and destruction of memory cells MC of a NAND type EEPROM, which are caused by performing regular memory operation using ineffective initial setup data.

As described above, when the initial setup operation does not properly complete at power-on, the regular memory operation is interrupted. When the effectiveness of the initial setup data read out from the initial setup data region (ROM Fuse) is not confirmed, the chip status is fixed to the fail status. In this manner, the following access to a memory cell can be suppressed. Therefore, it is possible to protect valuable cell data and memory cells from the breakage caused by performing memory operation based on ineffective initial setup data.

In the first embodiment, when the effectiveness of the initial setup data read out from a ROM Fuse is not confirmed, the case where the PASS/FAIL signal (=Low) is output from the status circuit 35 fixed to the fail status has been explained. The circuit arrangement for protecting a NAND type EEPROM is not limited to the aforementioned method and may be configured by another method in which, for example, a command register is arranged so as not to receive command data.

(Second Embodiment)

Figure 9:
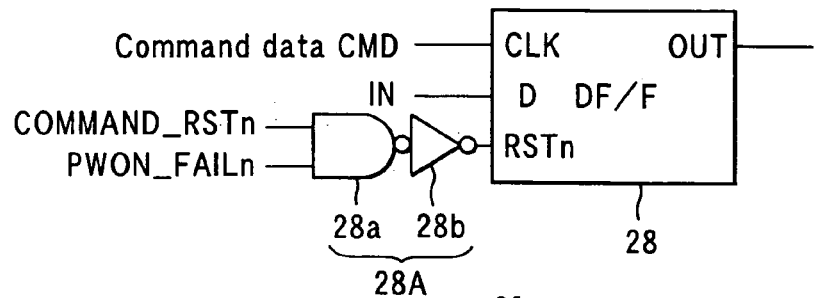
FIG. 9 is a circuit arrangement of a command register according to a second embodiment of the present invention, which is configured so as to prohibit the receipt of command data.

FIG. 9 is an example of a NAND type EEPROM according to a second embodiment of the present invention. FIG. 9 shows the case where the effectiveness of the initial setup data read out from a ROM Fuse is not confirmed at power-on. The circuit herein is arranged such that the chip status is fixed to "Fail" and a command register 28 does not receive a command data CMD.

To explain more specifically, when the effectiveness of the initial setup data is not confirmed at power-on, the command register 28 is set at a disable status. In this case, a storage-prohibiting circuit 28A, in which a NAND circuit 28a and an inverter circuit 28b are directly connected to each other, is connected to a reset input terminal RSTn of the command register 28. One of input terminals of the NAND circuit 28a, a command reset signal COMMAND_RSTn is input from the control circuit 30. To the other input terminal of the NAND circuit 28a, a fail signal PWON_FAILn is input from the status circuit 35. In this manner, the command register 28 is reset by the storage-prohibiting circuit 28A upon the supply of the fail signal PWON_FAILn (=Low). It is thus possible to prohibit the receipt of the command data CMD by the command register 28. As a result, in the case where the initial setup operation does not properly complete at power-on, the receipt of the command data CMD by the command register 28 is prohibited. Therefore, even if the command data CMD is mistakenly input when the PASS/FAIL signal (=Low) is not output to the outside, the regular memory operation can be prohibited.

Incidentally, the command register 28 may be configured so as to receive a predetermined command data CMD, thereby setting a test mode appropriately. Furthermore, a NAND type EEPROM may be configured such that the command resistor 28 does not receive the command data CMD even if a PASS/FAIL signal (=Low) is not used. More specifically, the setup circuit may be arranged simply by the command register 28 for storing command data CMD supplied from the outside and the storage-prohibiting circuit 28A for resetting the command register 28 without fixing the chip status to "Fail".

(Third Embodiment)

Figure 10:
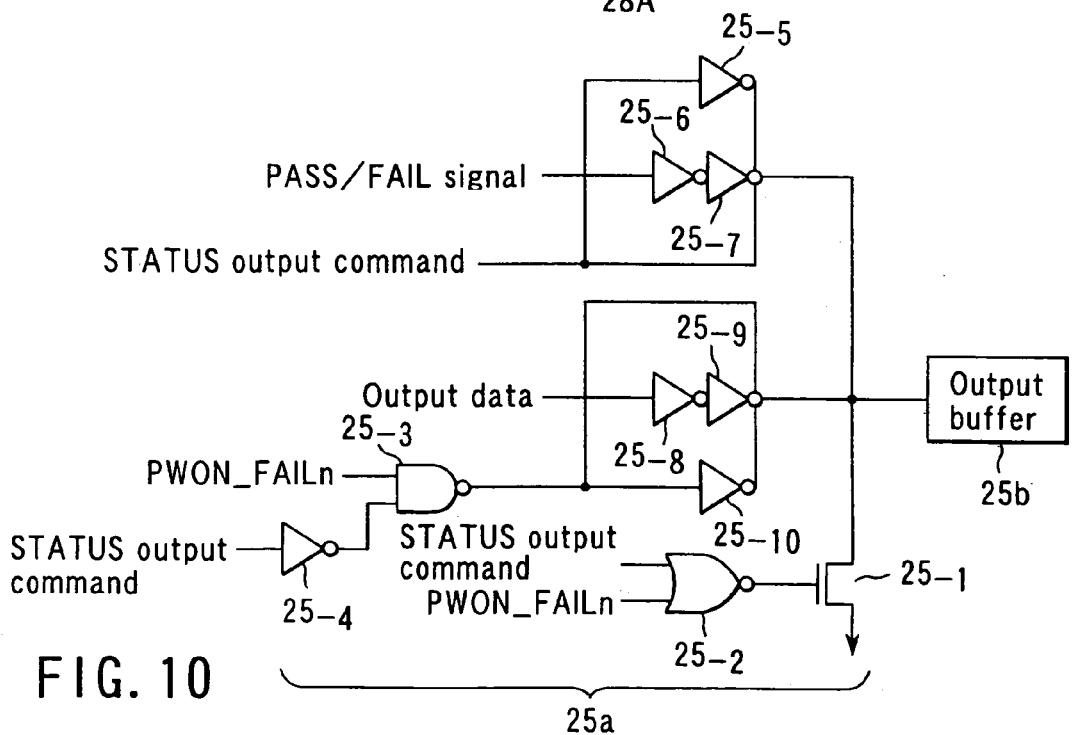
FIG. 10 is a circuit arrangement of a data output portion according to a third embodiment of the present invention, which is configured so as to fix input/output data output from an input/output (I/O) buffer.

FIG. 10 is an example of a NAND type EEPROM according to a third embodiment of the present invention. In FIG. 10, when the effectiveness of the initial setup data read out from a ROM Fuse at power-on is not confirmed, the chip status is fixed to "Fail" and the input/output data (output data) DA from the I/O buffer 25 is fixed. Incidentally, the data output portion alone is taken from the I/O buffer 25 and shown in FIG. 10.

In the NAND type flash memory, when the PASS/FAIL signal is turned to a "Fail" status, the data readout operation is performed. In some cases, which cell block is effective or not is determined based on the readout results. This is due to a specific characteristic of a NAND type flash memory, that is, "the presence of a defective block is accepted in a NAND type flash memory" (The NAND type flash memory has no problem if a defective block is present). To be more specific, as a result that the defective block is read out, a predetermined fixed value that indicates that writing has been made to all memory cells MC, is output. Also in the case where the initial setup operation does not properly complete, there is a possibility that the output data will be such that all cell blocks B0, B1 to Bn will appear defective blocks.

To be more specific, when the effectiveness of the initial setup data is not confirmed at power-on, the input into the output buffer 25b is fixed at the level "Low" by an output fixing circuit 25a, as shown in FIG. 10. In this embodiment, the output fixing circuit. 25a includes an NMOS transistor 25-1, a NOR circuit 25-2, NAND circuit 25-3, and inverter circuits 25-4 to 25-10. When a STATUS output command CMD is input from the outside to the I/O buffer 25, the output fixing circuit 25a works so as to preferentially output a PASS/FAIL signal (=Low) to the outside from the status circuit 35. On the other hand, when the STATUS output command CMD is not input from the outside, the data to be transferred to the output buffer 25b varies depending upon a fail signal PWON_FAILn supplied from the status circuit 35. For example, when the fail signal PWON_FAILn is "High", the output signal is made to input into the output buffer 25b. In contrast, when the fail signal PWON_FAILn is "Low", the input into the output buffer 25b is fixed at the level "Low". By this arrangement, when the initial setup operation does not properly complete at power-on (that is, when the fail signal PWON_FAILn is "Low"), the input/output data DA indicating such that all cell blocks B0, B1 to Bn will appear defective can be output to the outside.

According to this embodiment, when the initial setup operation does not complete properly, not only the PASS/FAIL signal (=Low) is output from the I/O buffer 25 to the outside but also the fact that the initial setup operation does not complete properly can be indicated from the input/output data DA. In addition, the input/output data DA indicates such that all cell blocks B0, B1 to Bn will appear defective blocks. As a result, the operator does not perform the following regular memory operation.

It is not always necessary to arrange the output fixing circuit so as to preferentially output a PASS/FAIL signal (=Low) from the status circuit 35 to the outside. For example, when the fail signal PWON_FAILn is "Low", the output fixing circuit is configured such that the input into the output buffer 25b is fixed at the level "Low". Only by this configuration, the following regular memory operation can be interrupted. In short, the setup circuit may be composed of an output buffer 25b for storing output data and an output fixing circuit (NMOS transistor 25-1, NOR circuit 25-2, NAND circuit 25-3 and an inverter circuit 25-8 to 25-10).

(Fourth Embodiment)

Figure 11A:
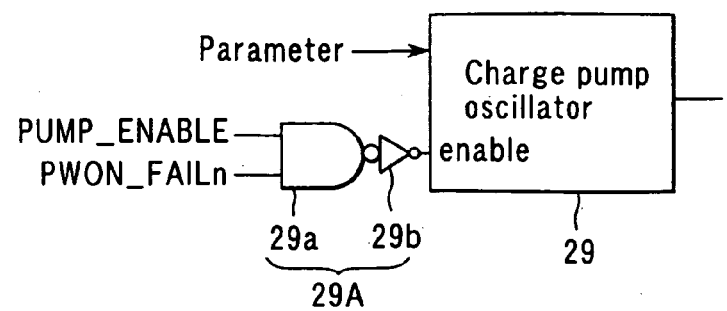
FIGS. 11A and 11B are circuit arrangements according to a fourth embodiment of the percent invention: an arrangement of a case in which a high voltage generation circuit is set at a disable state is shown in FIG. 11A and a case in which an interior timer circuit is set at a disable state is shown in FIG. 11B.
Figure 11B:
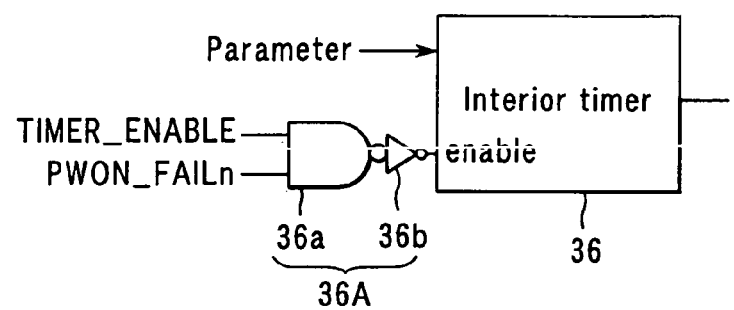
Figure 12:
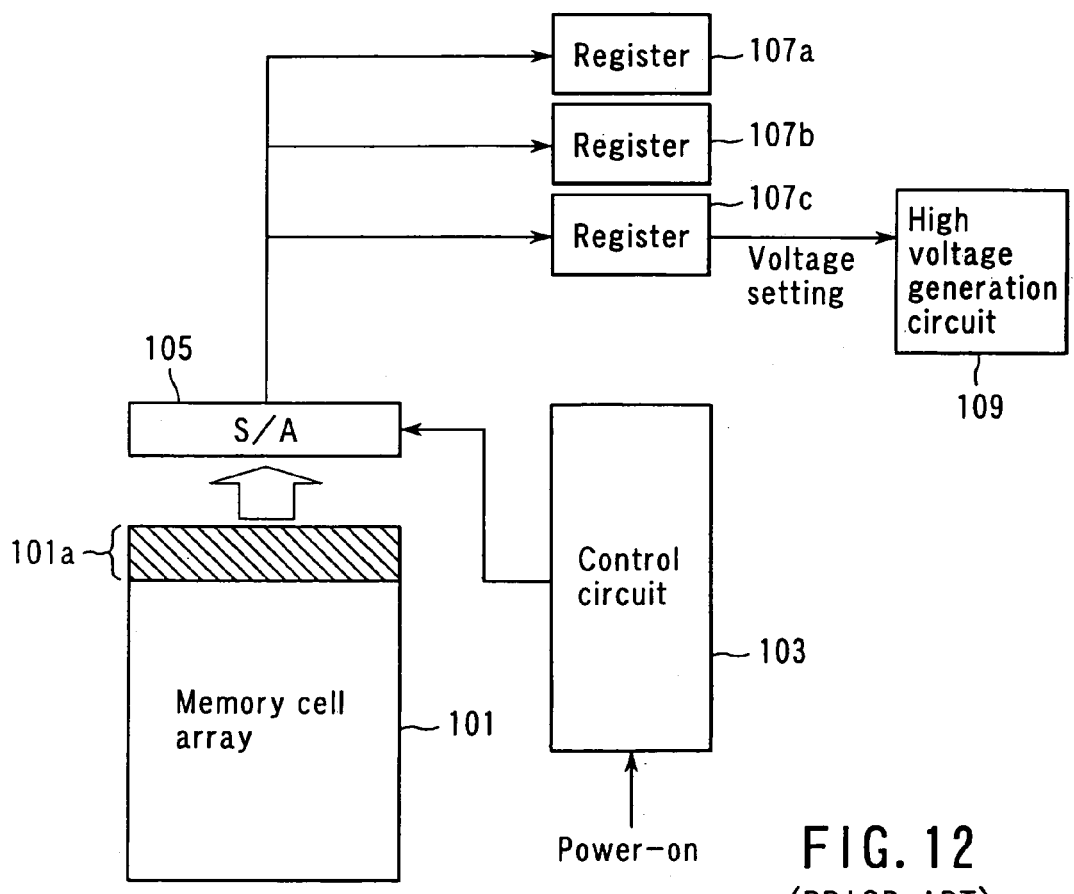
FIG. 12 is a block diagram for showing the initial setup operation in a conventional NAND type EEPROM.

FIGS. 11A and 11B are examples of a NAND type EEPROM-according to a fourth embodiment of the present invention. In these figures, when the effectiveness of the initial setup data read out from a ROM Fuse at power-on is not confirmed, the chip status is fixed to "Fail" and the high voltage generation circuit 29 and the interior timer circuit 36 are set at an inactive status. FIG. 11A shows an application example to the high voltage generation circuit 29 and FIG. 11B an application example to the interior timer circuit 36.

In the high voltage generation circuit 29, a voltage generation circuit setup circuit 29A is connected to its enable input terminal, as shown in FIG. 11A. The voltage generation circuit setup circuit 29A serves to set a charge pump oscillator composing the high voltage generation circuit 29 at a disable status. More specifically, the voltage generation circuit setup circuit 29A is configured by directly connecting a NAND circuit 29a and an inverter circuit 29b. To input terminals of the NAND circuit 29a, an enable signal (PUMP_ENABLE) from the high voltage generation circuit 29 and a fail signal PWON_FAILn from the status circuit 35 are respectively supplied.

In the interior timer circuit 36, an interior timer circuit setup circuit 36A is connected to its enable input terminal, as shown in FIG. 11B. The interior timer circuit setup circuit 36A serves to set the interior timer circuit 36 at a disable status. More specifically, the interior timer circuit setup circuit 36A is configured by directly connecting a NAND circuit 36a and an inverter circuit 36b. To input terminals of the NAND circuit 36a, an enable signal (TIMER_ENABLE) from the interior timer circuit 36 and a fail signal PWON_FAILn from the status circuit 35 are respectively supplied.

When the initial setup operation does not completed properly, if the high voltage generation circuit 29 and the interior timer circuit 36 are mistakenly operated, valuable cell data disappears or memory cells MC break. Then, in such a case, the high voltage generation circuit 29 and the interior timer circuit 36 are set at a nonactive status. By this arrangement, even if the initial setup operation does not complete properly, the cell data does not mistakenly disappear and memory cells MC do not break.

Even in this embodiment, it is not necessary to fix the chip status at a fail status. More specifically, the setup circuit can be formed of the high voltage generation circuit 29 and the voltage generation circuit setup circuit 29A for setting the high voltage generation circuit 29 at a disable state even when the initial setup operation does not complete properly. Similarly, the setup circuit can be formed of the interior timer circuit 36 and the interior timer circuit setup circuit 36A for setting the interior timer circuit 36 at a disable status when the initial setup operation does not complete properly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device operating method comprising:
    detecting turn-on of power;
    reading out initial setup data in a memory cell array by a readout circuit after detecting turn-on of power;
    determining whether the initial setup data read out by the readout circuit is effective or ineffective by a determination circuit; and
    setting up the nonvolatile semiconductor memory device in an operation-prohibiting state when the initial setup data is determined as ineffective by the determination circuit.

2. The nonvolatile semiconductor memory device operating method according to claim 1, wherein the memory cell array is an electrically programmable NAND type flash memory.

3. The nonvolatile semiconductor memory device operating method according to claim 1, wherein when the initial setup data is determined as ineffective, the determination circuit fixes a chip status to a fail status.

4. The nonvolatile semiconductor memory device operating method according to claim 1, which uses a control circuit which executes an initial setup operation, the control circuit executing the initial setup operation by causing a data latch circuit to latch the initial setup data when the initial setup data is determined as effective.

5. The nonvolatile semiconductor memory device operating method according to claim 1, wherein when the initial setup data is determined as effective, the determination circuit fixes a chip status to a pass status.

6. The nonvolatile semiconductor memory device operating method according to claim 1, wherein
    the memory cell array includes a redundancy cell array to be replaced with a defective cell; and
    the initial setup data includes control data which replaces the defective cell with the redundancy cell array.

7. The nonvolatile semiconductor memory device operating method according to claim 1, wherein the initial setup data includes control data which controls data write, erase and read operations.

8. The nonvolatile semiconductor memory device operating method according to claim 1, wherein
    the initial setup data includes control data which replaces a defective cell with the redundancy cell array and controls data write, erase and read operations, and reference data which confirms the effectiveness of the control data;
    the determination circuit determines whether the initial setup data is effective or ineffective based on whether or not the control data and the reference data correspond to each other.

9. The nonvolatile semiconductor memory device operating method according to claim 8, wherein the reference data is complementary to the control data.

10. The nonvolatile semiconductor memory device operating method according to claim 1, wherein the memory cell array includes a plurality of planes, and each of the plurality of planes has an initial setup data region established.

11. The nonvolatile semiconductor memory device operating method according to claim 10, wherein the same initial setup data is written in each initial setup data region of the plurality of planes; and
    the determination circuit determines whether the initial setup data is effective or ineffective for each initial setup data written in each initial setup data region.

12. The nonvolatile semiconductor memory device operating method according to claim 1, further comprising:
    setting an interior timer circuit in a nonactive state by setting the nonvolatile semiconductor memory device in an operation-prohibiting state.

13. The nonvolatile semiconductor memory device operating method according to claim 1, further comprising:
    setting a voltage generation circuit in a nonactive state by a voltage generation circuit setup circuit by setting the nonvolatile semiconductor memory device in an operation-prohibiting state.

14. The nonvolatile semiconductor memory device operating method according to claim 4, further comprising:
    causing the control circuit to externally output a busy signal until the initial setup operation finishes.

15. A nonvolatile semiconductor memory device operating method comprising:
    detecting turn-on of power;
    reading out initial setup data in a memory cell array after detecting turn-on of power;
    determining whether the initial setup data is effective or ineffective; and
    setting up the nonvolatile semiconductor memory device in an operation-prohibiting state when the initial setup data is determined as ineffective.

16. The nonvolatile semiconductor memory device operating method according to claim 15, wherein the memory cell array is an electrically programmable NAND type flash memory.

17. The nonvolatile semiconductor memory device operating method according to claim 15, wherein when the initial setup data is determined as ineffective, a chip status is turned to a fail status.

18. The nonvolatile semiconductor memory device operating method according to claim 15, wherein when the initial setup data is determined as effective, a chip status is turned to a pass status.

19. The nonvolatile semiconductor memory device operating method according to claim 15, wherein
    the memory cell array includes a redundancy cell array to be replaced with a defective cell; and
    the initial setup data includes control data which replaces the defective cell with the redundancy cell array.

20. The nonvolatile semiconductor memory device operating method according to claim 15, wherein the initial setup data includes control data which control data write, erase and read operations.

21. The nonvolatile semiconductor memory device operating method according to claim 15, wherein
the initial setup data includes control data which replaces a defective cell with the redundancy cell array and controls data write, erase and read operations, and reference data which confirms the effectiveness of the control data;
the initial setup data is determined whether effective or ineffective based on whether or not the control data and the reference data correspond to each other.

22. The nonvolatile semiconductor memory device operating method according to claim 21, wherein the reference data is complementary to the control data.

23. The nonvolatile semiconductor memory device operating method according to claim 15, wherein the memory cell array includes a plurality of planes, and each of the plurality of planes has an initial setup data region.

24. The Nonvolatile semiconductor memory device operating method according to claim 23, wherein the same initial setup data is written in each initial setup data region of the plurality of planes; and
the initial setup data is determined whether effective or ineffective for each initial setup data written in each initial setup data region.

25. The nonvolatile semiconductor memory device operating method according to claim 15, further comprising:
setting an interior timer circuit in a nonactive state by setting the nonvolatile semiconductor memory device in an operation-prohibiting state.

26. The nonvolatile semiconductor memory device operating method according to claim 15, further comprising:
setting a voltage generation circuit in a nonactive state by setting the nonvolatile semiconductor memory device in an operation-prohibiting state.

* * * * *